United States Patent [19]

Beck et al.

[11] Patent Number: 4,960,673

[45] Date of Patent: Oct. 2, 1990

[54] PHOTOPOLYMERIZABLE LAMINATE SUITABLE FOR PRODUCING PRINTING PLATES

[75] Inventors: Erich Beck, Harthausen; Bernd Bronstert, Otterstadt; Wolfgang Huemmer, Limburgerhof; Dieter Littmann, Hessheim, all of Fed. Rep. of Germany

[73] Assignee: BASF Aktiengesellschaft, Ludwigshafen, Fed. Rep. of Germany

[21] Appl. No.: 324,829

[22] Filed: Mar. 17, 1989

[30] Foreign Application Priority Data

Mar. 17, 1988 [DE] Fed. Rep. of Germany ....... 3808951

[51] Int. Cl.$^5$ ................................................ G03C 1/76
[52] U.S. Cl. ..................................... 430/271; 430/281; 430/302; 430/306; 430/905; 430/908; 430/909; 522/120; 522/144; 522/181
[58] Field of Search ............... 430/281, 271, 302, 306, 430/905, 908, 909, 273; 522/120, 144, 181

[56] References Cited

U.S. PATENT DOCUMENTS

| | | | |
|---|---|---|---|
| 3,654,020 | 4/1972 | Henkler et al. | 428/458 |
| 4,247,624 | 1/1981 | Foss | 430/281 |
| 4,292,152 | 9/1981 | Lechtken et al. | 430/627 |
| 4,387,157 | 6/1983 | Bronstert et al. | 430/271 |
| 4,547,454 | 10/1985 | Hoffmann et al. | 430/271 |

FOREIGN PATENT DOCUMENTS

| | | |
|---|---|---|
| 22886/83 | 5/1984 | Australia . |
| 0036301 | 9/1981 | European Pat. Off. . |
| 0081964 | 6/1983 | European Pat. Off. . |

*Primary Examiner*—Jack P. Brammer
*Attorney, Agent, or Firm*—Keil & Weinkauf

[57] ABSTRACT

Photopolymerizable laminates suitable for producing flexible and resilient printing plates carry on a dimensionally stable base at least one intermediate layer and on top thereof a photopolymerizable layer which consists essentially of a mixture of a water-soluble copolymer or derivative of polyvinyl alcohol, a specific copolymerizable mono-functional (meth)acrylate, a photoinitiator and a thermal polymerization inhibitor.

8 Claims, No Drawings

PHOTOPOLYMERIZABLE LAMINATE SUITABLE FOR PRODUCING PRINTING PLATES

The present invention relates to a photopolymerizable laminate suitable for producing printing plates, in particular flexographic printing plates, which on a dimensionally stable base carries at least one intermediate layer and on top thereof a relief-forming photopolymerizable layer which consists essentially of a mixture of polymeric binder, at least one ethylenically unsaturated polymerizable compound, photoinitiator and thermal polymerization inhibitor and contains specific water-soluble copolymers and also specific ethylenically unsaturated polymerizable compounds.

Photosensitive polymer compositions which contain partially hydrolyzed polyvinyl acetate and a polyfunctional acrylate or methacrylate combined with compatibility-improving polyhydric alcohols and can be used for producing laminates are known, for example from EP-A No. 0,081,964.

EP-A No. 224,164 describes light-sensitive recording materials which contain, as the polymeric binder, hydrolyzed or partially hydrolyzed graft copolymers of vinyl esters on polyalkylene oxides. The compatibility of the monomers listed there with the binder, however, is in many cases not sufficient to meet increased requirements in respect of image reproduction quality and resilience of printing plates produced therefrom.

EP-A No. 0,036,301 describes a light-sensitive polyamide resin mixture of alcohol-soluble polyamide, a nonpolymeric compound which has not only vinyl but also epoxy groups in one and the same molecule and can react with the polymeric binder to form copolymerization-capable polymers, and a polyfunctional vinyl monomer having

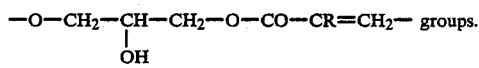

Accordingly, the use of phenyl glycidyl ether acrylate as a plasticizing component, combined with polyfunctional acrylates, in photopolymerizable laminates which contain alcohol-soluble modified polyamide as polymeric binder was already known.

Such compositions, however, are not suitable for the production of flexible and resilient flexographic printing plates owing to the required proportion of polyfunctional acrylates and the resulting high crosslinking density. In addition, the use of alcohol as developer medium for the production of the printing plate is undesirable for many application areas.

It is an object of the present invention to provide photopolymerizable laminates which are suitable for the production of flexible and resilient printing plates, which do not have the abovementioned disadvantages, and which are notable for excellent compatibility of monomeric and polymeric binder, water developability and high resilience coupled with low hardness without using extractable plasticizers.

We have surprisingly found that this object is achieved without having to use polyfunctional (meth)acrylates or binders functionalized with ethylenically unsaturated groups by combining in the photopolymerizable relief-forming layers phenyl glycidyl ether (meth)acrylates or similar compounds, i.e. specific monofunctional (meth)acrylates, with modified polyvinyl alcohol as polymeric binder.

The present invention accordingly relates to a photopolymerizable laminate suitable for producing flexible and resilient printing plates which on a dimensionally stable base carries at least one intermediate layer and on top thereof a photopolymerizable layer which consists essentially of a mixture of polymeric binder, at least one ethylenically unsaturated polymerizable compound, photoinitiator and thermal polymerization inhibitor, wherein in the relief-forming photopolymerizable layer the polymeric binder is a water-soluble copolymer or derivative of polyvinyl alcohol and the ethylenically unsaturated polymerizable compound is a compound of the general formula (I)

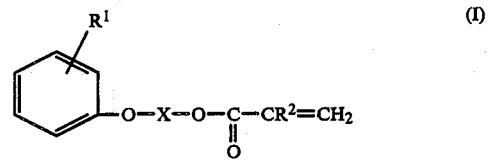

where $R^1$ is hydrogen or alkyl of from 1 to 10 carbon atoms or aryl of from 6 to 10 carbon atoms, $R^2$ is hydrogen or methyl, X is $-(CH_2-CH_2-O)_n-C_2H_4-$, $-C_2H_4-$, $-(CHCH_3-CH_2-O)_n-CHCH_3-CH_2-$,

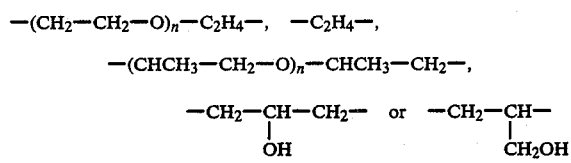

and n is from 0 to 8.

Suitable $R^1$, besides hydrogen, is for example alkyl of from 1 to 10 carbon atoms, e.g. methyl, ethyl, n-propyl, isopropyl, n-butyl, isobutyl, tert-butyl, pentyl, hexyl, n-octyl or isooctyl, or aryl, e.g. phenyl or naphthyl.

In the laminate according to the invention, an intermediate layer may contain a compound of the general formula (I) in the polymerized state, or there may be present on the dimensionally stable base as a first intermediate layer a thin layer of a customary adhesion promoter and on top thereof a second intermediate layer which contains a compound of the general formula (I) mixed with a polymeric binder in the polymerized state.

The relief-forming photopolymerizable layer of the laminate according to the invention can also be covered with a cover sheet removable by peeling.

Preferred compounds of the formula (I) are those where $R^1$ is methyl or hydrogen and X is the radical

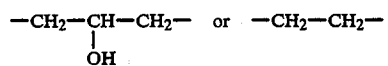

As water-soluble copolymer of polyvinyl alcohol it is preferable to use an at least partially hydrolyzed graft polymer of vinyl esters, in particular vinyl acetate, on polyethylene oxide. As water-soluble derivative of polyvinyl alcohol, it is preferable to use a polyvinyl alcohol partially esterified with methacrylic anhydride and/or a partially acetalated polyvinyl alcohol.

The present invention also provides a laminate of the type defined above which additionally contains a sensitometric regulator system, in which case the relief-forming photopolymerizable layer preferably contains at least one photoinitiator which on irradiation with actinic light initiates rapid photopolymerization in the layer and, in a conventional manner, a combination, which on irradiation with actinic light does not initiate any noticeable photopolymerization in the layer, of a soluble dye with a reducing agent for this dye which does not reduce the dye in the absence of actinic light but on irradiation is capable of reducing the dye in the excited electron state, as described for example in EP-A No. 114,341.

With the photopolymerizable laminate according to the invention it is possible to produce in a simple and advantageous manner printing plates having the plate hardness and resilience customary in flexographic printing which are in particular also suitable for printing on rough printing stocks.

There now follow specifics concerning the structural components of the laminates according to the invention.

Suitable dimensionally stable bases are the customary, dimensionally stable, rigid or preferably flexible base materials known per se, the type of base material also being determined by the intended use. Suitable are for example metallic base materials, for example aluminum, magnesium, copper, zinc, steel or multimetal plates, which can be used as such, or provided with a layer of adhesive, or used in a mechanically, chemically or electrochemically pretreated form optionally coated with adhesive. Suitable bases also include polymer films having a metallized surface, such as polyethylene terephthalate films coated with aluminum by vacuum vapor deposition. Preferred bases are aluminum sheets or foils and also dimensionally stable plastics films, in particular polyester films, such as polyethylene terephthalate films. These dimensionally stable bases in general have thicknesses of about 0.08-0.3 mm.

Between the base and the relief-forming photopolymerizable layer there may be one or more intermediate layers.

For instance, the base may have been coated with a layer of adhesion promoter or adhesive which has undergone thermal crosslinking. Suitable adhesive layers are for example those based on a mixture of polyol and polyisocyanate, which in general have a thickness of from 1 to 100, and preferably from 5 to 50, μm. Such adhesion-promoting layers are described for example in DE-A No. 1,597,515, DE-A No.-2,202,357, EP-A No.53,259 and EP-A No.53,258.

In place of such customary adhesive layers, whose qualitative and quantitative composition is in general adapted to the type of base material and the composition of the relief-forming layer or a further intermediate layer, the base may also be coated with a thin layer of a compound of the formula (I), preferably the phenyl glycidyl ether (meth)acrylate admixed with a little (photo)polymerization initiator, and then be polymerized thermally or by irradiation, forming in general adhesive layers on the base of from 1 to 100 μm in thickness.

As a further intermediate layer arranged between the adhesive coat on the base and the relief-forming photopolymerizable layer it is possible to use mixtures of polymeric binder and polymerizable ethylenically unsaturated compounds, preferably a compound of the general formula (I), which contain polymerization or photopolymerization initiators with or without further customary additives such as dyes, plasticizers, regulators and thermal polymerization inhibitors, and are thermally or radiation-polymerized prior to application of the photopolymerizable relief-forming layer. Such intermediate layers can be from 1 to 200, preferably from 5 to 100, um in thickness. In such intermediate layers, examples of possible polymeric binders are water-soluble polymers used in the relief layer but also for example polyvinyl acetates or polyvinyl acetals, and possible polymerizable ethylenically unsaturated compounds are for example aryl glycidyl ether acrylates or methacrylates, phenoxyethyl acrylate, and mixtures of these monomers with other polymerizable monomers, for example monofunctional or polyfunctional (meth)acrylic esters.

According to the invention, the photopolymerizable relief-forming layer consists of a mixture of a polymeric binder, at least one ethylenically unsaturated polymerizable compound, at least one photoinitiator, and a polymerization inhibitor, the polymeric binder being a water-soluble vinyl alcohol copolymer or a derivative of polyvinyl alcohol and the ethylenically unsaturated polymerizable compound being a compound of the general formula (I), preferably an aryl glycidyl (meth)acrylate. The use of further ethylenically unsaturated copolymerizable compounds, especially polyfunctional ones, is not necessary to obtain satisfactory results. To obtain certain properties, for example graduated plate hardness, the use of further, even polyfunctional, copolymerizable compounds can be of advantage. As further copolymerizable ethylenically unsaturated compounds of this type it is possible to use one or more compounds having at least one photopolymerizable olefinically unsaturated double bond. Here, it is possible to use the known monomers, oligomers and unsaturated polymers used for the production of relief plates and photopolymer letterpress, intaglio and offset printing laminates, the type of which monomers, oligomers and unsaturated polymers depends on the intended purpose of the mixtures and also on the type of the other mixture components. It is possible to use monomers having two or more olefinically unsaturated photopolymerizable double bonds on their own or mixed with monomers having only one olefinically unsaturated photopolymerizable double bond. It is also possible to use polymers having a plurality of lateral or terminal olefinically unsaturated double bonds in place of or mixed with the monomers. Examples of suitable monomers are di- and polyacrylates and di- and polymethacrylates as are preparable by esterifying diols or polyols with acrylic acid or methacrylic acid, such as di- and tri(meth)acrylates of ethylene glycol, diethylene glycol, triethylene glycol or polyethylene glycols having a molecular weight of up to about 500, 1,2-propanediol, 1,3-propanediol, neopentylglycol (2,2-dimethylpropanediol), 1,4-butanediol, 1,1,1-trimethylolpropane, glycerol or pentaerythritol, and also the monoacrylates and monomethacrylates of such diols and polyols, for example mono-, di-, tri- or tetraethylene glycol monoacrylate, monomers having two or more olefinically unsaturated bonds which contain urethane groups and/or amide groups, such as those low molecular weight compounds prepared from aliphatic diols of the aforementioned type, organic diisocyanates and hydroxyalkyl (meth)acrylates. It is also possible to use acrylic acid, methacrylic acid and derivatives thereof such as (meth)acrylamide, N-hydroxymethyl(meth)acrylamide or the (meth)acrylates of monoalcohols of from 1 to 6 carbon atoms.

Suitable monomers also include reaction products of glycidyl ethers with acrylic acid or methacrylic acid, for example reaction products of bisphenol A diglycidyl ether or butanediol diglycidyl ether with acrylic acid or methacrylic acid.

The ethylenically unsaturated copolymerizable compound of the general formula (I) or the mixture of this compound with one or more further ethylenically unsaturated compounds of the abovementioned type is in general used in amounts of from 10 to 70, preferably from 30 to 60, % by weight, based on the total amount of polymeric binder and photopolymerizable monomers in the relief-forming layer.

According to the invention, the polymeric binder is a water-soluble vinyl alcohol copolymer and/or a water-soluble derivative of polyvinyl alcohol. Examples of such suitable polymeric binders are elastomeric graft polymers soluble or dispersible in aqueous solvents and prepared by polymerization of vinyl esters in the presence of polyalkylene oxides and a free radical polymerization initiator, hydrolysis or partial hydrolysis of the resulting graft copolymer and optionally subsequent esterification or transesterification of vinyl alcohol units of the hydrolyzed or partially hydrolyzed graft copolymer and which consist essentially of structural units of the composition

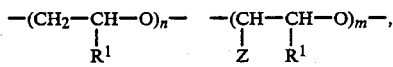

where Z is a grafted-on side branch having structural units

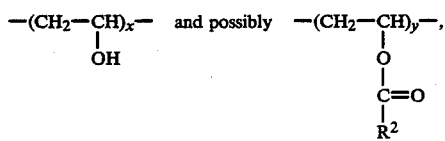

$R^1$ is hydrogen and/or alkyl of 1 or 2 carbon atoms,
$R^2$ is alkyl and/or alkenyl with or without carboxyl substituents,
$x > y$, $n > m$, m is at least 2, $n+m = 20-2,000$ and $$\frac{(n+m)}{(x+y)} = \frac{1}{4} \text{ to } \frac{3}{1}$$

as described in EP-A No. 224,164.

Similar suitability is possessed by polyvinyl alcohols of the type described in EP-A No. 220,507, which are partially esterified with methacrylic acid, and by partially acetalated polyvinyl alcohol.

Such suitable polyvinyl alcohols in general have molecular weights $\overline{M}_n$ of from about 4,000 to 100,000, preferably of from 10,000 to 70,000. The polymeric binder is in general present in the photopolymerizable relief-forming layers according to the invention in an amount of from 30 to 90, preferably from 40 to 70, % by weight, based on the total amount of polymeric binder and photopolymerizable monomers.

The photopolymerizable relief-forming layers according to the invention additionally contain, as is usual in the art, at least one photoinitiator, in general in an amount of from 0.01 to 10, in particular of from 0.01 to 3, % by weight, based on the total amount of the photopolymerizable layer. Suitable photoinitiators are those compounds which on exposure to actinic light are capable of forming free radicals and initiate rapid photopolymerization in the layer. Examples of possible photoinitiators are acyloins and acyloin ethers, aromatic diketones and derivatives thereof and polycyclic quinones. High suitability is possessed by benzoin and α-hydroxymethylbenzoin and in particular their alkyl ethers of from 1 to 8 carbon atoms, such as benzoin isopropyl ether, α-hydroxymethylbenzoin methyl ether, or benzoin methyl ether, benzil monoketals such as benzil dimethyl ketal, benzil methyl ethyl ketal, benzil methyl benzyl ketal, or benzil neopentyl ketal, and diarylphosphine oxides as described in DE-A No. 2,909,992, preferably 2,6-dimethoxybenzoyldiphenylphosphine oxide and in particular 2,4,6-trimethylbenzoyldiphenylphosphine oxide. Preference is given to such types and amounts of photoinitiators that initiation of the photopolymerization on imagewise exposure to actinic light, in particular UV light, takes only short minimum irradiation times, preferably not more than a few minutes.

The photopolymerizable relief-forming layers according to the invention advantageously also contain in addition thermal polymerization inhibitors, such as hydroquinone, p-methoxyphenol, dinitrobenzene, p-quinone, methylene blue, β-naphthol, N-nitrosamines such as N-nitrosodiphenylamine, phenothiazine, phosphorous esters such as triphenyl phosphite or the salts and in particular the alkali metal and aluminum salts of N-nitrosocyclohexylhydroxylamine. The inhibitors are mixed into the photopolymerizable mixtures of the relief-forming polymerizable layer in general in an amount of from 0.001 to 3% by weight, in particular in an amount of from 0.003 to 1% by weight, based on the total amount of polymerizable layer.

In a conventional manner, it is of course also possible to include customary additives, such as plasticizers, saturated low molecular weight compounds having amide or alcohol groups, waxes, pigments and the like.

In a particularly advantageous embodiment of the present invention, the photopolymerizable layer may additionally contain a regulator system such as described for example in EP-A No. 114,341.

Regulator systems are mixtures of certain dyes (1) with mild reducing agents (2) for the particular dye (1) used (cf. also EP-A No. 0,114,341). The mixture of (1)+(2) on imagewise exposure to actinic light should not initiate any noticeable photopolymerization in the layer of the photopolymerizable mixture, which is ascertainable with a few experiments. If for example the irradiation time for novel, preferably essentially solvent-free, layers of the photopolymerizable, photoinitiator-containing mixture X is of the order of hours or minutes, then the same layer without the photoinitiator should advantageously not contain any marked proportions of photopolymerized layer during the subsequent development of the relief plate by washout even if the irradiation time employed is ten times as long; in general, less than 20% by weight of the irradiated monomer should have been photopolymerized.

Suitable dyes (1) for the photopolymerizable mixtures of the relief-forming layer are in particular those of the series of the phenoxazine dyes, for example:

Capri Blue GN (C.I. 51000), Zapon Fast Blue 3 G (C.I. 51005), Gallo Blue E (C.I. 51040), Fast New Blue 3 R (C.I. 51175), Nile Blue A (C.I. 51180), Fast Green M (C.I. 51210), Fast Black L (C.I. 51215) and also Rhodanil Blue, the salt or amide of Rhodamine B (Basic Violet 10, C.I. 45170) and Nile blue (Basic Blue 12, C.I.

51180), compounds of the series of the phenazinium dyes, e.g. neutral red (C.I. 50040), neutral violet (C.I. 50030), Azine Scarlet G (C.I. 50045), Rhoduline Heliotrope 3 B (C.I. 50055), Neutral Blue C (C.I. 50150), Azine Green GB (C.I. 50155), Safranine B (C.I. 50200), Indamine Blue B (C.I.50204), Rhoduline Red G (C.I. 50215), Rhoduline Blue GG Extra (C.I. 50220), Indazine GB (C.I. 50221), Safranine T (C.I. 50240), mauveine (C.I. 50245), naphthyl red (C.I. 50370) and also Nigrosine Black T (C.I. 50415), acridinium dyes, e.g. acriflavine (C.I. 46000), Acridine Orange (C.I. 46005), Acridine Scarlet J (C.I. 46015), Acridine Yellow G (C.I. 46025), Aurazine G (C.I. 46030), Crystal Phosphine GG (C.I. 46035), Phosphine E (C.I. 46045), flaveosine (C.I. 46060), benzoflavine (C.I. 46065) and Rheonine A (C.I. 46075) and also phenothiazinium dyes, e.g. methylene blue or thionine. It is also possible to use (isobutylthio)anthraquinone as dye (1).

The choice of dye (1) used in the photopolymerizable mixture is chiefly determined by esthetics. For instance, visual inspection of the printing plates is particularly simple with the compounds Neutral Red (C.I. 50040), Safranine T (C.I. 50240) and also Rhodanil Blue, which are preferably used in the photopolymerizable mixture.

The novel layers may thus contain combined with dye (1) an amount of a reducing agent (2) sufficient for the dye (1), which does not reduce the dye (1) in the absence of actinic light but on irradiation is capable of reducing the dye in the excited state, in particular to the semiquinone. Examples of such mild reducing agents are ascorbic acid, anethole, thiourea, diethylallylthiourea, hydroxylamine derivatives, in particular N-allylthiourea and preferably salts of N-nitrosocyclohexylhydroxylamine, in particular the potassium and aluminum salts. The latter are also known for use as inhibitors of thermal polymerization in photopolymerizable mixtures. The amount of reducing agent added is in general from about 0.005 to 5, and in particular from 0.01 to 1, % by weight, based on the total amount of photopolymerizable layer, but should not be less than the reduction equivalent of the amount of dye (1) used. In many cases, the addition of from 3 to 10 times the amount of dye (1) used has proven useful.

The photopolymerizable laminates are in general produced by applying a homogeneous mixture of the components of the photopolymerizable relief layer, with or without the addition of solvents or solvent mixtures, to a dimensionally stable base advantageously pre-coated with one or more adhesion-promoting layers.

The homogeneous photopolymerizable mixture is preparable in a conventional manner by mixing the individual components in a customary mixing apparatus, for example in kneaders, extruders or stirred kettles. The homogeneous mixture is then in general applied in a thickness of from 25 to 6,000, preferably of from 200 to 1,000, µm to the dimensionally stable base coated with the adhesion-promoting layer or with one or more intermediate layers.

It can also be advantageous to employ on top of the photopolymerizable relief-forming layer a top or protective layer, for example a thin layer of polymer which is soluble in the developer medium, for example polyvinyl alcohol or polyvinyl alcohol/polyethylene oxide copolymer.

The photopolymerizable laminates according to the invention are processable into relief plates, in particular printing plates, in a conventional manner. To this end, the layer of photosensitive material is in general subjected to imagewise exposure under actinic light from light sources such as UV fluorescent tubes, high, medium or low pressure mercury lamps, fluorescent tubes and the like, where the emitted wavelength is preferably within the range from 300 to 420 nm. The unexposed and uncrosslinked areas of the layer may be removed by spraying, washing, brushing and the like with aqueous solvents or water. It is an advantage of the laminates according to the invention that they permit washout of the unexposed parts of the layer with pure water without the addition of organic solvents. Advantageously, developed relief and printing plates are dried at up to 120° C. and, if desired, afterexposed to actinic light at the same time or thereafter.

The printing plates produced from the recording materials according to the invention are suitable in particular for flexographic printing, newsprint flexographic printing and similar printing processes.

The laminates according to the invention which contain in the relief-forming layer a compound of the general formula (I), in particular phenyl glycidyl ether (meth)acrylate, as photopolymerizable ethylenically unsaturated compound are very advantageous to manufacture and to process into printing plates which combine high resilience with low hardness.

The invention is illustrated by the Examples below. Parts and percentages are by weight, unless otherwise stated. Parts by volume bear the same relation to parts by weight as the liter to the kilogram.

The plate hardness was measured by using an apparatus for determining the Brinell hardness (in accordance with German Standard Specification DIN 53 456) under an applied load (the Pfund film hardness determination apparatus) by measuring the depth of penetration of a quartz ball 5.926 mm in diameter.

EXAMPLE 1

A graft copolymer is obtained as described in EP-A No. 224,164 by thermal polymerization of 3 parts of vinyl acetate in the presence of 2 parts of polyethylene oxide having a average molecular weight of 35,000 g/mol and subsequent transesterification in methanolic sodium hydroxide solution. A solution is prepared from 55 parts of this graft copolymer, 45 parts of phenyl glycidyl ether acrylate (=reaction product of phenyl glycidyl ether and acrylic acid), 1.5 parts of benzyl dimethyl ketal, 0.5 part of the potassium salt of N-nitrosocyclohexylhydroxylamine, 0.05 part of Safranine T (C.I. 50 240), 50 parts of water and 50 parts of methanol by stirring at 60° C.

The solution is poured onto a piece of steel sheet coated with an adhesion-promoting layer and smoothed down in such a way as to leave on drying a layer of the photopolymerizable mixture 500 µm in thickness. The laminate thus obtained is irradiated with actinic light through a negative for 4 minutes and developed with water for 2 minutes at 20° C. in a commercial spray washer. Drying gives a resilient printing plate having a smooth, nontacky surface, a very well structured relief and a Brinell hardness (according to German Standard Specification DIN No. 53 456) of 10 cN/mm$^2$.

EXAMPLE 2

A solution of 10 parts of a partially hydrolyzed polyvinyl acetate (degree of polymerization of 400, degree of hydrolysis 80 mol %) whose free hydroxyl groups have been esterified with 5 mol % of acrylic acid, 50 parts of a polyethylene oxide/polyvinyl alcohol graft copolymer (for example Mowiol® 04-M1 from Hoechst), 40 parts of phenyl glycidyl ether acrylate, 1.2 parts of benzil dimethyl ketal, 0.5 part of the potassium salt of N-nitrosocyclohexylhydroxylamine and 0.05 part of Safranine T in 50 parts of water and 50 parts of methanol is used to produce a laminate by the method described in Example 1.

Imagewise exposure, developing in water and drying give a resilient printing plate having a smooth surface, a very well structured relief and a Brinell hardness of 35 cN/mm$^2$.

EXAMPLE 3

A solution of 10 parts of a partially hydrolyzed polyvinyl acetate (degree of polymerization of 400, degree of hydrolysis 80 mol %) whose free hydroxyl groups have been esterified with 5 mol % of acrylic acid, 50 parts of the polyethylene oxide/polyvinyl alcohol graft copolymer as described in Example 1, 40 parts of phenyl glycidyl ether acrylate, 1.2 parts of benzil dimethyl ketal, 0.5 part of the potassium salt of N-nitrosocyclohexylhydroxylamine and 0.05 part of Safranine T in 50 parts of water and 50 parts of methanol is used to produce a laminate by the method described in Example 1.

Imagewise exposure, developing in water and drying give a resilient printing plate having a well structured relief and a Brinell hardness of 14 cN/mm$^2$.

EXAMPLE 4

A solution of a photopolymerizable mixture as described in Example 1 is poured onto a polyester film coated with a 2 μm thick layer of polyvinyl alcohol and smoothed down in such a way as to leave on drying a 500 μm thick photopolymerizable layer. A sheet of aluminum which has been degreased by washing with acetone is coated with phenyl glycidyl ether acrylate containing 2% of benzil dimethyl ketal in solution in such a way that irradiation with actinic light gives a 50 μm thick layer of the polymerized acrylate.

The photopolymeric layer is laminated using a 1:1 mixed ethanol/water mixture with the base so prepared and the polyester film is peeled off to give a laminate from which printing plates showing excellent adhesion between relief layer and base are obtained by the method described above.

EXAMPLE 5

Example 3 is repeated, except that the aluminum sheet is replaced by a 0.2 mm thick polyethylene terephthalate film as base. Again, printing plates showing excellent adhesion to the base are obtained.

COMPARATIVE EXAMPLE 1

A solution of 25 parts of a polyethylene oxide/polyvinyl alcohol graft copolymer (for example Mowiol 04-M1 from Hoechst AG) whose free hydroxyl groups have been esterified with 4 mol % of acrylic acid, 45 parts of a graft copolymer prepared as described in Example 1, 30 parts of ethylene glycol dimethacrylate, 1.2 parts of benzil dimethyl ketal, 0.5 part of the potassium salt of N-nitrosocyclohexylhydroxylamine and 0.05 part of Safranine T in 50 parts of water and 50 parts of methanol is used as described in Example 1 to produce a laminate.

To produce a printing plate from the laminate thus produced, an irradiation time of more than 25 minutes is required.

Hard, brittle plates having a rough surface and a poorly developed relief layer are obtained.

We claim:

1. A photopolymerizable laminate suitable for producing flexible and resilient printing plates comprising a dimensionally stable base, a relief-forming photopolymerizable layer and at least one intermediate layer between the dimensionally stable base and the relief-forming photopolymerizable layer, the relief-forming photopolymerizable layer consisting essentially of a mixture of polymeric binder, at least one ethylenically unsaturated polymerizable compound, at least one photoinitiator and at least one thermal polymerization inhibitor, wherein said polymeric binder is at least one water-soluble compound selected from the group consisting of graft polymers soluble or dispersible in aqueous solvents and prepared by polymerization of vinyl esters in the presence of polyalkylene oxides and a free-radical polymerization initiator, hydrolysed or partially hydrolysed graft polymers thereof, and graft polymers obtained by subsequent esterification or transesterification of vinyl alcohol units of such hydrolysed or partially hydrolysed graft polymer, polyvinyl alcohols which are partially esterified with acrylic or methacrylic acid and polyvinyl alcohols which are partially acetalated, and said ethylenically unsaturated polymerizable compound is a compound of the formula (I)

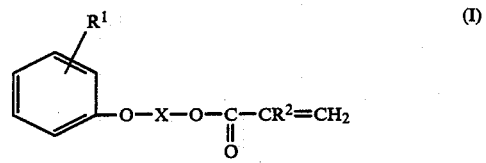

wherein R$^1$ is hydrogen or alkyl of from 1 to 10 carbon atoms or aryl of from 6 to 10 carbon atoms, R$^2$ is hydrogen or methyl, X is —(CH$_2$—CH$_2$—O)$_n$—C$_2$—H$_4$—, —C$_2$H$_4$—, —(CHCH$_3$—CH$_2$—O)$_n$—CHCH$_3$—CH$_2$—,

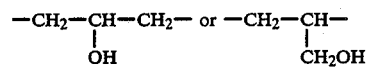

and n is from 0 to 8.

2. The laminate of claim 1, wherein at least one intermediate layer contains a compound of the formula (I) in the polymerized state.

3. The laminate of claim 1, wherein there are present on the dimensionally stable base as a first intermediate layer a thin layer of a customary adhesion promoter and on top thereof a second intermediate layer which contains a compound of the formula (I) mixed with a polymeric binder in the polymerized state.

4. The laminate of claim 1, wherein the relief-forming photopolymerizable layer has been covered with a cover sheet removable by peeling.

5. The laminate of claim 1, wherein in the formula (I) R$^1$ is hydrogen or methyl and X is the radical

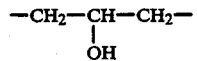

6. The laminate of claim 1, wherein the polymeric binder is an at least partially hydrolyzed graft copolymer of a vinyl ester on polyethylene oxide.

7. The laminate of claim 1, wherein the polymeric binder is a polyvinyl alcohol partially esterified with methacrylic acid or a partially acetalated polyvinyl alcohol.

8. The laminate of claim 1, wherein the relief-forming photopolymerizable layer contains at least one photoinitiator which on irradiation with actinic light initiates rapid photopolymerization in the layer and, in a conventional manner, a combination, which on irradiation with actinic light does not initiate any noticeable photopolymerization in the layer, of a dye with a reducing agent for this dye which does not reduce the dye in the absence of actinic light but on irradiation is capable of reducing the dye in the excited state.

* * * * *